United States Patent
Pi et al.

(10) Patent No.: US 9,530,478 B2
(45) Date of Patent: Dec. 27, 2016

(54) MEMORY DEVICE USING SPIN HALL EFFECT AND METHODS OF MANUFACTURING AND OPERATING THE MEMORY DEVICE

(71) Applicants: Ung-hwan Pi, Seoul (KR);
Kwang-seok Kim, Seoul (KR);
Kee-won Kim, Suwon-si (KR);
Sung-chul Lee, Osan-si (KR);
Young-man Jang, Hwaseong-si (KR)

(72) Inventors: Ung-hwan Pi, Seoul (KR);
Kwang-seok Kim, Seoul (KR);
Kee-won Kim, Suwon-si (KR);
Sung-chul Lee, Osan-si (KR);
Young-man Jang, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/162,144

(22) Filed: Jan. 23, 2014

(65) Prior Publication Data

US 2014/0211552 A1    Jul. 31, 2014

(30) Foreign Application Priority Data

Jan. 25, 2013 (KR) .......... 10-2013-0008630

(51) Int. Cl.
*G11C 11/00* (2006.01)
*G11C 11/16* (2006.01)
(Continued)

(52) U.S. Cl.
CPC .......... *G11C 11/1675* (2013.01); *G11C 11/161* (2013.01); *G11C 11/1673* (2013.01);
(Continued)

(58) Field of Classification Search
CPC ........ H01L 43/08; H01L 43/02; H01L 27/228; H01L 27/222; H01L 43/10; H01L 43/12; G11C 11/1675; G11C 11/16; G11C 11/1673; G11C 11/18; G11C 11/161; G11C 11/15
(Continued)

(56) References Cited

U.S. PATENT DOCUMENTS 7,211,874 B2 *   5/2007   Guo et al. ................ 257/422
2004/0240265 A1  12/2004  Lu et al.
(Continued)

FOREIGN PATENT DOCUMENTS

KR   20100013930 A   2/2010
KR   20100131604 A   12/2010

OTHER PUBLICATIONS

Liu et al., Spin-Torque Switching With the Giant Spin Hall Effect of Tantalum, Science 336, 555 (2012).
(Continued)

*Primary Examiner* — Thong Q Le
(74) *Attorney, Agent, or Firm* — Harness, Dickey & Pierce P.L.C.

(57) ABSTRACT

A memory device using a spin hall effect, and methods of manufacturing and operating the memory device, include applying a first operational current to a bit line of the memory device such that a spin current is applied to a magnetic tunnel junction (MTJ) cell coupled to the bit line due to a material in the bit line, wherein the bit line is electrically connected to a word line via the MTJ cell, and the word line intersects the bit line.

10 Claims, 3 Drawing Sheets

(51) Int. Cl.
*H01L 43/08* (2006.01)
*H01L 27/22* (2006.01)
*G11C 11/18* (2006.01)

(52) U.S. Cl.
CPC ............ *G11C 11/18* (2013.01); *H01L 27/222* (2013.01); *H01L 43/08* (2013.01)

(58) Field of Classification Search
USPC ....... 365/158, 171, 210.14, 189.07, 97, 100, 365/148
See application file for complete search history.

(56) References Cited

U.S. PATENT DOCUMENTS

| | | |
|---|---|---|
| 2005/0014297 A1 | 1/2005 | Nejad |
| 2005/0063223 A1 | 3/2005 | Tran |
| 2005/0167657 A1 | 8/2005 | Nickel et al. |
| 2005/0270828 A1 | 12/2005 | Motoyoshi |
| 2007/0103964 A1 | 5/2007 | Kim et al. |
| 2008/0151596 A1 | 6/2008 | Fontana, Jr. et al. |
| 2008/0308937 A1 | 12/2008 | Catabay et al. |
| 2009/0032795 A1 | 2/2009 | Kim et al. |
| 2009/0072246 A1 | 3/2009 | Genrikh et al. |
| 2009/0262467 A1 | 10/2009 | Xi et al. |
| 2010/0097063 A1 | 4/2010 | Ando et al. |
| 2010/0271862 A1 | 10/2010 | Yoon et al. |
| 2010/0284213 A1 | 11/2010 | Savransky |
| 2010/0284217 A1 | 11/2010 | Ogimoto et al. |
| 2011/0058409 A1 | 3/2011 | Chen et al. |
| 2011/0063899 A1 | 3/2011 | Ogimoto |
| 2011/0121418 A1 | 5/2011 | Xi et al. |
| 2011/0149649 A1 | 6/2011 | Hwang |
| 2011/0153533 A1 | 6/2011 | Jackson et al. |
| 2011/0317471 A1 | 12/2011 | Chien et al. |
| 2012/0012956 A1* | 1/2012 | Saitoh ................... B82Y 25/00 257/427 |
| 2014/0008742 A1* | 1/2014 | Chen et al. ................... 257/421 |

OTHER PUBLICATIONS

Ioan Mihai Miron et al., *Perpendicular switching of a single ferromagnetic layer induced by in-plane current injection*, Nature, p. 1-4 (2011).

* cited by examiner

MEMORY DEVICE USING SPIN HALL EFFECT AND METHODS OF MANUFACTURING AND OPERATING THE MEMORY DEVICE

CROSS-REFERENCE TO RELATED APPLICATIONS

This application claims the benefit of priority under 35 U.S.C. §119 from Korean Patent Application No. 10-2013-0008630, filed on Jan. 25, 2013, in the Korean Intellectual Property Office, the disclosure of which is herein incorporated by reference in its entirety.

BACKGROUND

1. Field

Example embodiments relate to memory devices, and more particularly, to memory devices using a spin hall effect and/or methods of manufacturing and operating the memory device.

2. Description of the Related Art

In general spin transfer torque magnetic random access memories (STT-MRAMs), a transistor is formed in each cell in order to minimize interference between the cell and a peripheral cell. Thus, each cell has a structure in which one transistor and one capacitor are formed, that is, a 1T-1C structure. Accordingly, the size of each cell is 6 $F^2$ or more.

As the need for high integration of semiconductor devices increases, research into further reduction in the size of a unit cell has been actively conducted. As a result, memory cells including only a storage node have been introduced.

Memory cells, that is, cross point devices including only a storage node and not including a cell transistor have been often studied in resistive RAMs (RRAMs).

In RRAMs, current flows through a cell, and thus multiple writing does not occur. For example, when data is simultaneously written in three unit cells, current flows through each unit cell, and thus the magnitude of current applied through a word line (W/L) becomes three times in order to write data in the three unit cells. In other words, the magnitude of current needed for multiple writing in the RRAM changes frequently according to a number of unit cells which are objects of the multiple writing. Thus, an operation is performed through single writing in which data is written in a single unit cell at a time, instead of multiple writing. A memory operation speed is reduced due to the operation through the single writing.

In addition, when the unit cell is a cross point device, leakage current flows to an adjacent cell during a read operation. Thus, because a resistance value of a unit cell to be actually read cannot be accurately measured, errors may occur during the read operation.

SUMMARY

Example embodiments relate to memory devices, and more particularly, to memory devices using a spin hall effect and/or methods of manufacturing and operating the memory device.

Provided are memory devices that have unit cells reduced in size, do not interfere in adjacent cells, may perform multiple writing, and use a spin hall effect.

Also provided are methods of manufacturing and operating the memory devices.

According to example embodiments, a memory device includes a bit line; a word line intersecting the bit line; and a magnetic tunnel junction (MTJ) cell between the word line and the bit line such that the MTJ cell is in a region where the bit line intersects the word line, wherein the bit line includes a material layer applying a spin current to the MTJ cell.

The bit line may include a first bit line layer contacting the MTJ cell; and a second bit line layer on the first bit line layer.

The first bit line layer may include a material having spin hall coupling.

The second bit line layer may include a material layer having a specific resistance lower than a specific resistance of the material having spin hall coupling in the first bit line layer.

The MTJ cell may include a free layer having a horizontal magnetization direction or a vertical magnetization direction.

According to other example embodiments, a method of operating a memory device using a spin hall effect includes writing data in a magnetic tunnel junction (MTJ) cell of the memory device by, applying a write current to a bit line of the memory device, and generating a magnetic field around a word line of the memory device. The word line intersects the bit line. The MTJ cell is between the word line and the bit line such that the MTJ cell is in a region where the bit line intersects the word line. The bit line includes a material layer applying a spin current to the MTJ cell.

The bit line may include a first bit line layer contacting the MTJ cell, and a second bit line layer on the first bit line layer, and the write current may be applied in a direction parallel to upper surfaces of the first and second bit line layers.

The applying the write current may generate a spin current using a first material having spin hall coupling, and the first material having spin hall coupling may be in the first bit line layer.

According to further example embodiments, a method of operating a memory device using a spin hall effect includes reading data in the magnetic tunnel junction (MTJ) cell by, forming a potential difference between a first bit line and a word line of the memory device, measuring current passing through the MTJ cell, and comparing the measured current and a reference value. The first bit line includes a material layer applying a spin current to the MTJ cell. The word line intersects the first bit line, and the MTJ cell is between the word line and the first bit line in a region where the first bit line intersects the word line.

The memory device may further include a plurality of bit lines including the first bit line, wherein, during the reading of data, the first bit line is selected, and the remaining bit lines are in a floating state.

The memory device may further include a plurality of word lines maintaining equipotential during the reading of data.

According yet further example embodiments a method of operating a memory device includes applying a first operational current to a bit line of the memory device such that a spin current is applied to a magnetic tunnel junction (MTJ) cell coupled to the bit line due to a material in the bit line. The bit line is electrically connected to a word line via the MTJ cell, and the word line intersects the bit line.

The bit line may have a structure including a plurality of layers, and the material in the bit line is in a bottommost layer of the bit line. The first operational current may flow in a direction parallel to an upper surface of the bottommost layer.

Writing data in the MTJ cell may include simultaneously applying the first operational current to the bit line and a second operational current to the word line. The applying the second operational current may result in the generation of a magnetic field, and the MTJ cell may be in an area of the magnetic field.

A free layer of the MTJ cell may have a magnetization direction that is changeable by the magnetic field and the spin current.

The spin current may be applied to the MTJ cell due to at least one property selected from a spin hall effect, a spin hole angle and spin orbit coupling of the material in the bit line.

A data state of a cross point device (MTJ cell) of a memory device using a spin hall effect according to example embodiments varies due to a spin current caused by a spin hall effect. At this time, because the spin current does not flow through a unit cell, a degradation in the MTJ cell is minimized, and thus the memory device may be stably operated. In addition, because the cross point device does not include a cell transistor, a memory cell may be independently designed irrespective of the performance and size of the cell transistor. Furthermore, the integration of the memory device may be increased.

In addition, because a transistor for applying write and read currents is located on the outside of a cell region rather than being disposed adjacent to the cell, the performance of the cell may further be increased irrespective of the size of the cell. That is, a greater amount of current may be applied to the cell.

Furthermore, because write and read operations are independently performed, margins of the operations do not affect the mutual operations. Accordingly, a write margin and a read margin may be independently set.

In addition, because the cross point device is capable of multi writing, the cross point device may overcome an operational limitation of a cross point device of the related art which is capable of only series writing. Thus, a high-speed memory device may be realized.

Furthermore, because the read operation is performed in a parallel biasing manner, a stable read operation that is not influenced by a leakage current may be performed.

BRIEF DESCRIPTION OF THE DRAWINGS

Example embodiments will be more clearly understood from the following detailed description taken in conjunction with the accompanying drawings.

FIG. 1 is a plan view of a chip including a memory device using a spin hall effect according to example embodiments;

FIG. 2 is a schematic plan view illustrating a configuration of a partial region of FIG. 1;

FIG. 3 is a cross-sectional view of a portion taken along line 3-3' of FIG. 2;

FIG. 4 is a plan view of FIG. 3; and

FIG. 5 is a cross-sectional view illustrating a method of operating (reading) the memory device according to example embodiments.

DETAILED DESCRIPTION

Figure 1:
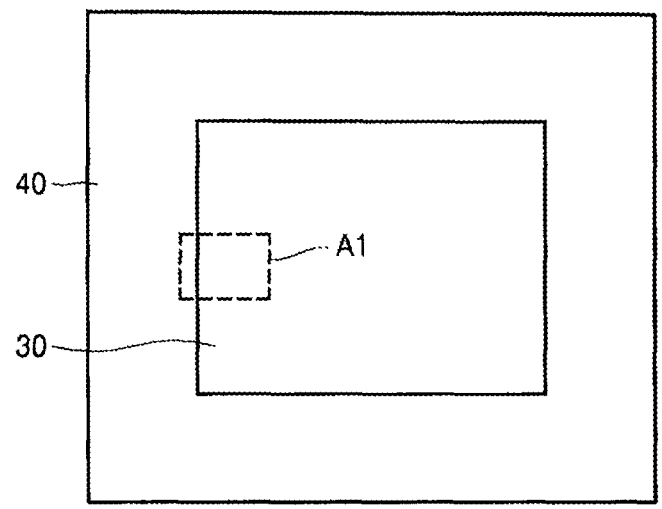
FIGS. 1-5 represent non-limiting, example embodiments as described herein.

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various features will be described in detail with reference to the attached drawings. However, example embodiments described are not limited thereto.

Hereinafter, a memory device using a spin hall effect according to example embodiments of the present disclosure and methods of manufacturing and operating the memory device will be described in detail with reference to the accompanying drawings. In the drawings, the thicknesses of layers and regions are exaggerated for clarity.

First, the memory device (hereinafter, referred to as a first memory device) using a spin hall effect according to an embodiment of the present disclosure will be described. Here, the first memory device may be an MRAM.

FIG. 1 is a schematic plan view of a memory chip including a memory device using a spin hall effect according to example embodiments Referring to FIG. 1, a memory chip includes a memory cell region 30 and a peripheral portion 40. The memory cell region 30 includes a first memory device. The memory cell region 30 includes a plurality of cells constituting an array. The plurality of cells each may be a cross point device not including a cell transistor. Here, the cross point device may be a magnetic tunnel junction (MTJ) cell. The peripheral portion 40 may include a plurality of transistors and a sense amp. The configuration of the peripheral portion 40 may be similar to that of a peripheral portion of an existing memory chip including a cross point device.

Figure 2:
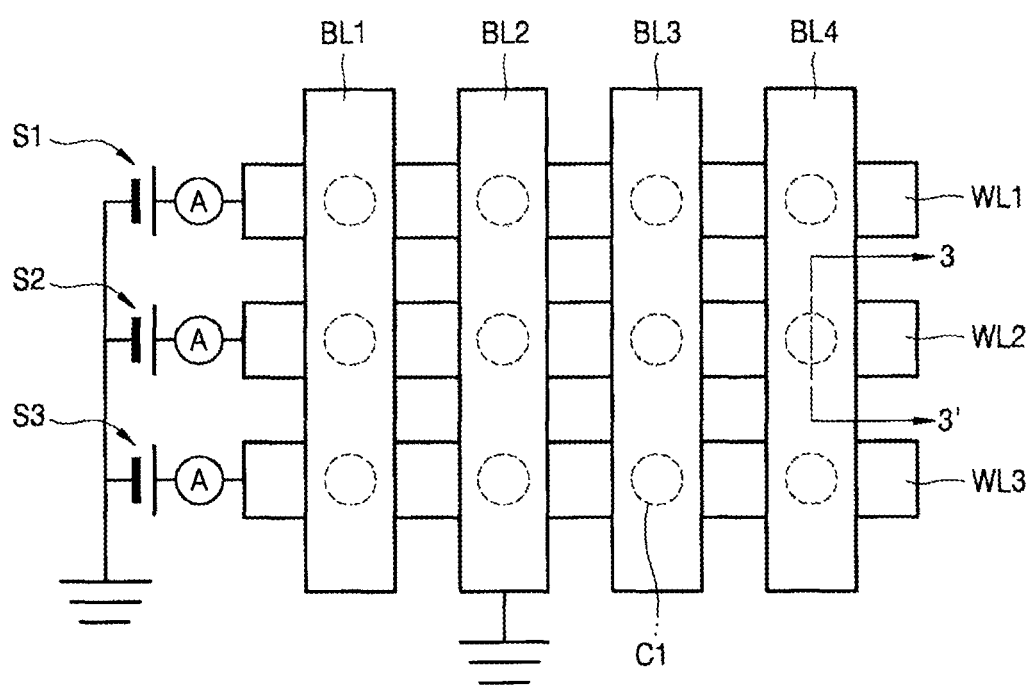

FIG. 2 is a schematic plan view illustrating a configuration of a partial region of FIG. 1.

FIG. 2 illustrates configurations of elements included in a first region A1 of FIG. 1. The first region A1 includes parts of the memory cell region 30 and the peripheral portion 40. The first region A1 is mostly a memory cell region.

Referring to FIG. 2, first to third word lines WL1 to WL3 are arranged in parallel with each other at set (or predetermined) intervals. First to fourth bit lines BL1 to BL4 are arranged in parallel with each other at set (or predetermined) intervals. The first to third word lines WL1 to WL3 and the first to fourth bit lines BL1 to BL4 are arranged so as to intersect each other. Dotted circles C1 at regions where the first to fourth bit lines BL1 to BL4 and the first to third word lines WL1 to WL3 intersect each other are unit cells and denote the first memory device. First to third power sources S1 to S3 are connected to ends of the first to third word lines WL1 to WL3, respectively. The first to third power sources S1 to S3 may be used as power sources that generate a magnetic field required for data writing, or may be used as power sources required for data reading.

Although FIG. 2 illustrates four bit lines and three word lines, the first region A1 of FIG. 1 may include four or more bit lines and three or more word lines.

Figure 3:
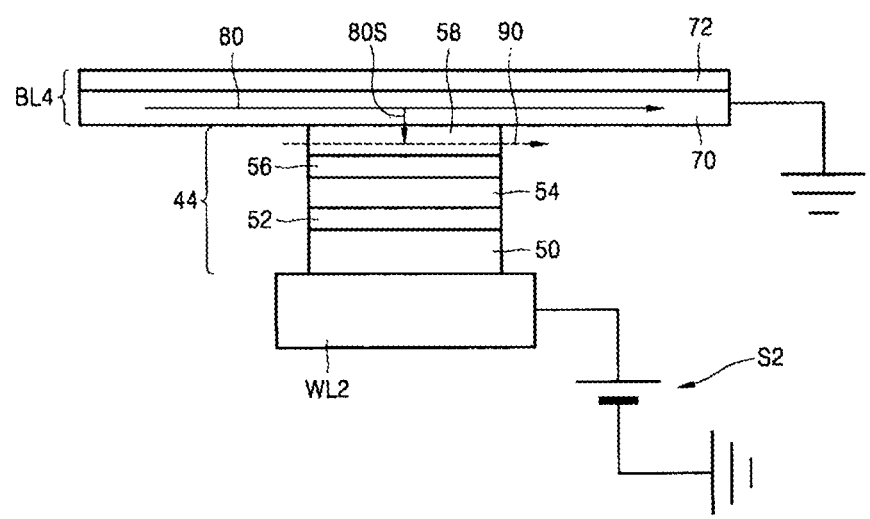

FIG. 3 illustrates a cross section taken along line 3-3' of FIG. 2. A configuration of the first memory device may be seen from FIG. 3.

Referring to FIG. 3, a buffer layer 50, a pinning layer 52, a pinned layer 54, a tunnel barrier 56, and a free layer 58 are sequentially stacked on the second word line WL2. The buffer layer 50, the pinning layer 52, the pinned layer 54, the tunnel barrier 56, and the free layer 58 may constitute an MTJ cell. The second word line layer WL2 is a layer that generates a magnetic field for data writing, and may be formed of, for example, copper (Cu) or aluminum (Al). The buffer layer 50 may be formed of tantalum (Ta) or ruthenium (Ru), but the present disclosure is not limited to these materials. The pinning layer 52 may be an antiferromagnetic layer having a horizontal or vertical magnetization direction. For example, the pinning layer 52 may be a PtMn layer. The pinned layer 54 may be a synthetic antiferromagnet (SAF) layer, and may be a layer including, for example, a CoFe layer, an Ru layer, and a CoFeB layer that are sequentially stacked thereon. The pinned layer 54 may be a CoPt multilayer instead of the SAF layer having the vertical magnetization direction, for convenience of a process. The tunnel barrier 56 may be a metal oxide layer, and may be, for example, an MgO layer or an $AlO_x$ layer. The free layer 58 that may be switched by a spin current may be, for example, a CoFeB layer having a vertical magnetization direction. The free layer 58 may be a material layer having a horizontal magnetization direction. The fourth bit line BL4 is formed on the free layer 58. The fourth bit line BL4 horizontally intersects the second word line WL2. The fourth bit line BL4 partially contacts the free layer 58. The fourth bit line BL4 includes a first bit line layer 70 and a second bit line layer 72 that are sequentially stacked. The first bit line layer 70 contacts the free layer 58. The layer configuration of the first to third bit lines BL1 to BL3 of FIG. 2 may be the same as that of the fourth bit line BL4. The first bit line layer 70 may be a layer formed of a material having a large spin hall effect, a material having a large spin hole angle, or a material having a large spin orbit coupling. The first bit line layer 70 may be a layer formed of a material that is relatively heavy in a periodic table. The first bit line layer 70 may be, for example, a tungsten (W) layer, a tantalum (Ta) layer, a platinum (Pt) layer, or a CuBi layer. The second bit line layer 72 may be a conductive layer having a lower specific resistance than the first bit line layer 70, and may be, for example, an Al layer or a Cu layer.

In FIG. 3, a dotted line 90 horizontally passing through the free layer 58 indicates a magnetic field generated in the second word line WL2 during a write operation. Reference numeral 80 indicates current flowing through the fourth bit line BL4 during the write operation. Reference numeral 80S denotes a spin current generated from the current 80 flowing through the fourth bit line BL4 during the write operation. The spin current 80S flows in a direction perpendicular to the current 80 flowing through the fourth bit line BL4. The spin current 80S flows to the free layer 58. The magnetization of the free layer 58 may be switched by a magnetic field 90 and the spin current 80S.

Figure 4:
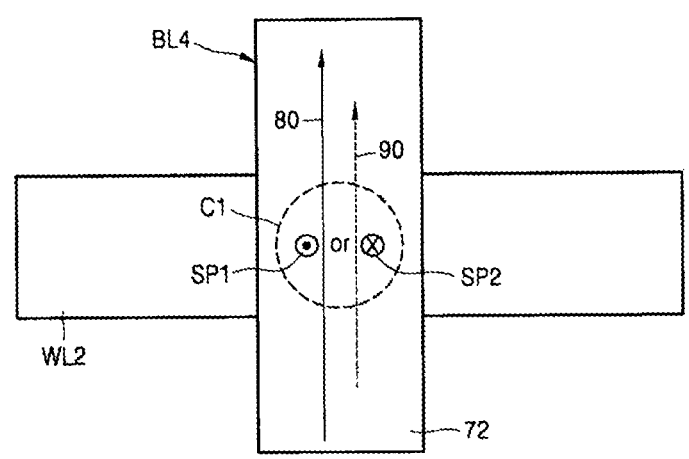

FIG. 4 is a plan view of FIG. 3.

Referring to FIG. 4, the second word line WL2 and the fourth bit line BL4 intersect each other. The current 80 flowing through the fourth bit line BL4 and the magnetic field 90 passing through the free layer 58 may be parallel to each other in a region where the second word line WL2 and the fourth bit line BL4 intersect each other, that is, a region where the cross point device or the MTJ cell 44 is located.

The spin current 80S flowing to the free layer 58 according to directions of the current 80 and the magnetic field 90 may be a vertical spin-up current SP1 or a vertical spin-down current SP2. The vertical magnetization of the free layer 58 may be switched by the spin currents SP1 and SP2. In other words, a data state of the free layer 58 may change.

Next, a method of operating the first memory device will be described.

<Writing>

Referring to FIG. 3, the write current 80 is applied to the fourth bit line BL4. At this time, the spin current 80S is generated in a direction perpendicular to the write current 80 by the spin hall effect of the first bit line layer 70 and is then applied to the free layer 58. Current for generating a magnetic field is applied to the second word line WL2 in conjunction with the application of the write current 80. The current may be applied from a second power source S2. A magnetic field is generated around the second word line WL2 by the current, and the magnetic field 90 parallel to the write current 80 appears in the free layer 58. The magnetization direction of the free layer 58 is determined by the spin current 80S and the magnetic field 90. In other words, data is written in the first memory device by the spin current 80S and the magnetic field 90 (or the data state changes).

<Reading>

Figure 5:
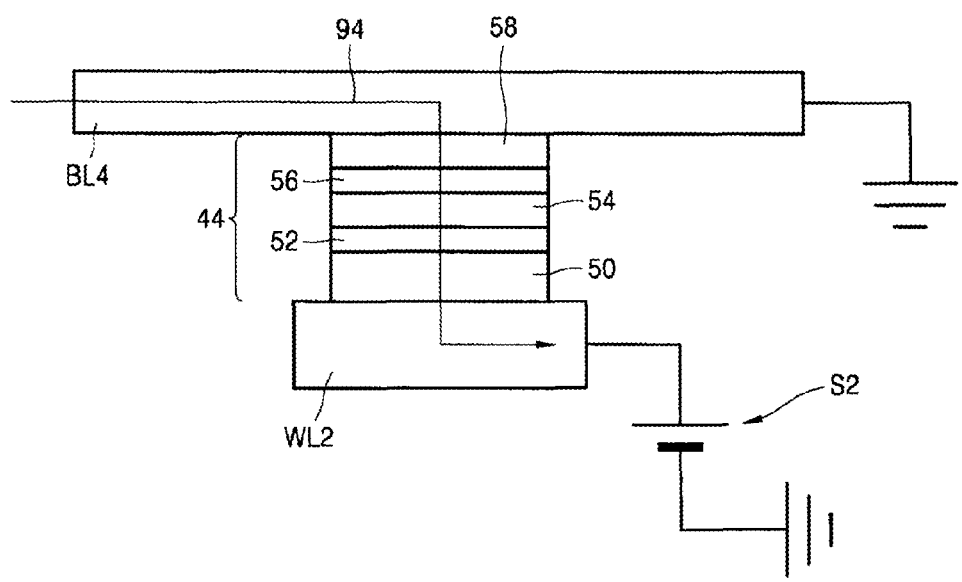

FIG. 5 is a cross-sectional view illustrating a method of operating (reading) the memory device according to example embodiments.

Referring to FIG. 5, a potential difference is formed between the fourth bit line BL4 and the second word line WL2. The potential difference may occur by the second power source S2. The current 94 flows through the fourth bit line BL4, the MTJ cell 44, and the second word line WL2 by the potential difference. The value of the current 90 varies according to a resistance state of the MTJ cell 44, that is, the magnetization direction of the free layer 58 and the magnetization direction of the pinned layer 54. Therefore, the measured current may be compared with a comparison value so as to determine whether or not the resistance of the MTJ cell 44 is low (data 0 or data 1) or whether or not the resistance of the MTJ cell 44 is high (data 1 or data 0). In this manner, data may be read in the MTJ cell 44.

On the other hand, the same voltage as a voltage applied to the second word line WL2 may be applied to other word lines during the data reading (parallel biasing) so as to maintain equipotential between the first to fourth word lines WL1 to WL4. The rest of bit lines BL1 to BL3 other than the fourth bit line BL4 may be in a floating state. Accordingly, only data of the MTJ cell 44 in the region where the fourth bit line BL4 and the second word line WL2 intersect each other may be accurately read.

Next, a method of manufacturing the first memory device of the present disclosure will be described.

After the MTJ cell 44 is formed on the second word line WL2 so as to have a stacking order as illustrated in FIG. 3, the first bit line layer 70 of the fourth bit line BL4 may be formed so as to contact the free layer 58 of the MTJ cell 44, and the second bit line layer 72 may be formed on the first bit line layer 70. At this time, the first and second bit line layers 70 and 72 may be formed of the above-described material.

It should be understood that the example embodiments described therein should be considered in a descriptive sense only and not for purposes of limitation. Descriptions of features within the example embodiments should typically be considered as available for other similar features in other example embodiments.

What is claimed is:

1. A memory device using a spin hall effect, comprising:
   a bit line;
   a word line intersecting the bit line; and
   a magnetic tunnel junction (MTJ) cell between the word line and the bit line such that the MTJ cell is in a region where the bit line intersects the word line,
   wherein the bit line includes a material layer configured to apply a spin current to the MTJ cell,
   the bit line includes a first bit line layer on the MTJ cell, and a second bit line layer on the first bit line layer,
   the first bit line layer includes a material having spin hall coupling, and
   the second bit line layer includes a material layer having a specific resistance lower than a specific resistance of the material having spin hall coupling in the first bit line layer.

2. The memory device of claim 1, wherein the MTJ cell includes a free layer having a horizontal magnetization direction.

3. The memory device of claim 1, wherein the MTJ cell includes a free layer having a vertical magnetization direction.

4. A method of operating a memory device using a spin hall effect, comprising:
   writing data in a magnetic tunnel junction (MTJ) cell of the memory device by,
      applying a write current to a bit line of the memory device, and
      generating a magnetic field around a word line of the memory device,
   wherein the word line intersects the bit line,
   the MTJ cell is between the word line and the bit line such that the MTJ cell is in a region where the bit line intersects the word line,
   the bit line includes a material layer applying a spin current to the MTJ cell,
   the bit line includes a first bit line layer on the MTJ cell, and a second bit line layer on the first bit line layer,
   the applying the write current generates a spin current using a first material having spin hall coupling, the first material having spin hall coupling being in the first bit line layer, and
   the second bit line layer includes a second material layer having a specific resistance lower than a specific resistance of the first material having spin hall coupling in the first bit line layer.

5. A method of operating a memory device using a spin hall effect, comprising:
   reading data in the magnetic tunnel junction (MTJ) cell by,
      forming a potential difference between a first bit line and a word line of the memory device,
      measuring current passing through the MTJ cell, and
      comparing the measured current and a reference value,
   wherein the first bit line includes a first bit line layer on the MTJ cell, and a second bit line layer on the first bit line layer, the first bit line layer being a material layer applying a spin current to the MTJ cell,
   the word line intersects the first bit line, the MTJ cell is between the word line and the first bit line in a region where the first bit line intersects the word line, the memory device further includes a plurality of bit lines, the plurality of bit lines including the first bit line, and the first bit line contacts the MTJ cell.

6. The method of claim 5, wherein, during the reading of data, the first bit line is selected, and remaining bit lines are in a floating state.

7. The method of claim 5, further comprising:
a plurality of word lines maintaining equipotential during the reading of data.

8. A method of operating a memory device, comprising:
applying a first operational current to a bit line of the memory device such that a spin current is applied to a magnetic tunnel junction (MTJ) cell coupled to the bit line due to a material in the bit line,
wherein the bit line is electrically connected to a word line via the MTJ cell,
the word line intersects the bit line,
the bit line has a stack structure including a plurality of layers,
the material in the bit line is in a bottommost layer of the bit line,
writing data in the MTJ cell includes simultaneously applying the first operational current to the bit line and a second operational current to the word line,
the applying the second operational current results in the generation of a magnetic field, and
the MTJ cell is in an area of the magnetic field.

9. The method of claim 8, wherein a free layer of the MTJ cell has a magnetization direction that is changeable by the magnetic field and the spin current.

10. The method of claim 8, wherein the spin current is applied to the MTJ cell due to at least one property selected from a spin hall effect, a spin hole angle and spin orbit coupling of the material in the bit line.

* * * * *